United States Patent
Suzaki et al.

[19]

[11] Patent Number: 6,087,048
[45] Date of Patent: Jul. 11, 2000

[54] METHOD OF PRODUCING BLOCK MASK FOR ELECTRON-BEAM LITHOGRAPHY APPARATUSES

[75] Inventors: Yoshio Suzaki; Takayuki Sakakibara; Kiichi Sakamoto, all of Tokyo, Japan

[73] Assignee: Advantest Corporation, Tokyo, Japan

[21] Appl. No.: 09/257,538

[22] Filed: Feb. 24, 1999

[30] Foreign Application Priority Data

Feb. 27, 1998 [JP] Japan .................................. 10-046724

[51] Int. Cl.$^7$ ....................................................... G03F 9/00
[52] U.S. Cl. .................................................................. 430/5
[58] Field of Search ................................. 430/5, 322, 296

[56] References Cited

U.S. PATENT DOCUMENTS

| | | | |
|---|---|---|---|
| 4,264,711 | 4/1981 | Greeneich | 430/296 |
| 5,254,438 | 10/1993 | Owen et al. | 430/296 |

*Primary Examiner*—S. Rosasco
*Attorney, Agent, or Firm*—Christie, Parker & Hale, LLP

[57] ABSTRACT

Disclosed is a method of producing a block mask, which is employed in an electron-beam lithography apparatus, with high precision irrespective of the size of openings. The electron-beam lithography apparatus is of a type that produces a unit pattern at a time by transmitting an electron beam through openings selected from among a plurality of kinds of openings of a block mask, links the unit pattern with a previous one, and repeats this process to delineate a desired pattern. The method consists of four steps. At the first step, a resist is applied to the surface of a substrate of a block mask. At the next step, the resist is exposed to delineate patterns of a plurality of kinds of openings. At the next step, the exposed resist is developed. At the next step, the substrate of the block mask is etched. Herein, at the step of exposing the resist to delineate the patterns of a plurality of kinds of openings, for exposing the resist to delineate a pattern of openings that are larger than a predetermined size, the perimeters of corresponding opening portions of the resist are exposed by a predetermined width. However, the insides of the corresponding opening portions remain unexposed. Once etching is completed, the perimeter of each large opening portion becomes a penetrating hole. The inside thereof is detached from the substrate of the block mask. A larger hole is thus realized. Consequently, even when the etching is carried out under the same conditions for etching performed to create small openings, large openings can be created with high precision.

4 Claims, 5 Drawing Sheets

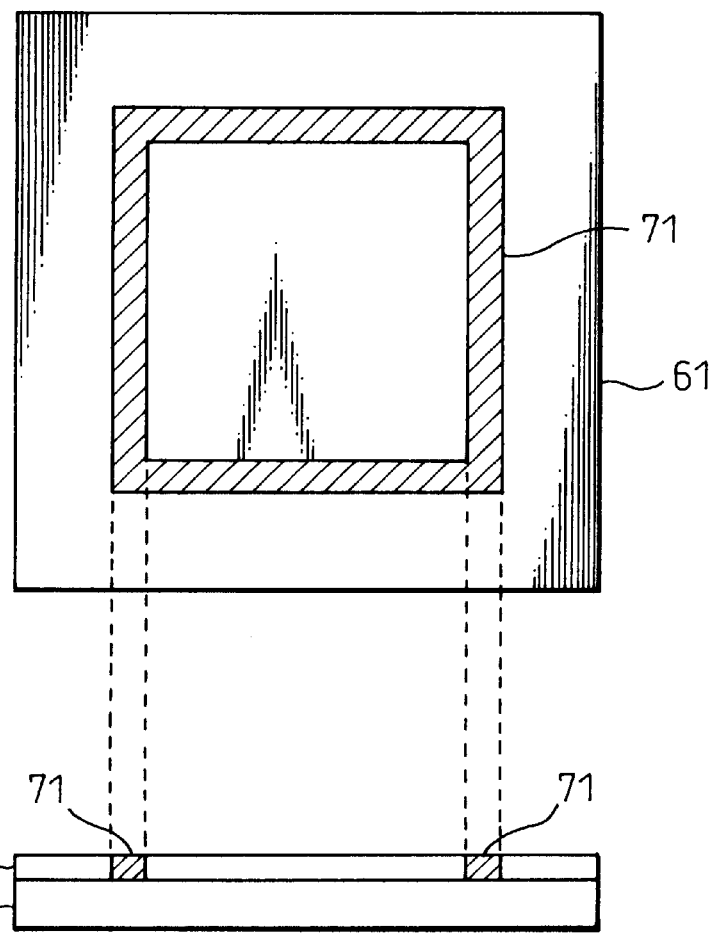
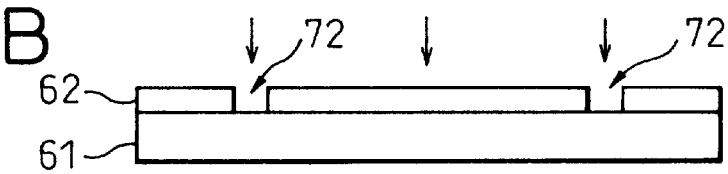
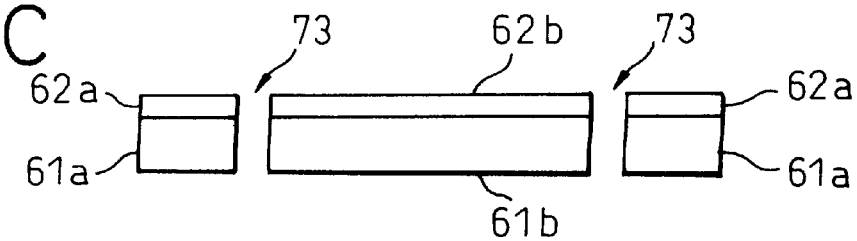

METHOD OF PRODUCING BLOCK MASK FOR ELECTRON-BEAM LITHOGRAPHY APPARATUSES

BACKGROUND OF THE INVENTION

1. Field of the Invention

The present invention relates to a method of producing a block mask to be employed in electron-beam lithography apparatuses of a block lithography type. More particularly, this invention is concerned with a method of producing a block mask to be employed in electron-beam lithography apparatuses according to which openings can be created as per designed values. Specifically, when patterns of openings having different sizes are delineated on a block mask by performing lithography, corresponding opening portions of a resist are processed by performing etching. Herein, the openings have a size as per a designed value.

2. Description of the Related Art

The trend of semiconductor integrated circuits is higher-density integration of components due to advances in microprocessing technology and microprocessing technology requirements are becoming more severe. Above all, photolithography, the lithographic technology adopted by existing step-and-repeat lithography systems with reduction or the like, will reach its limits. Electron-beam lithography is a technology that has the potential of overtaking photolithography.

Electron-beam lithography apparatuses occur as variable rectangular lithography types, a block lithography types, and a multi-beam lithography types. The present invention relates to a block lithography type of electron-beam lithography apparatus. Block lithography is a technique for printing graphics. According to the block lithography, a pattern that is a unit of repeated graphics is delineated on a transparent substrate of a mask, an electron beam is transmitted to the transparent substrate in order to delineate the unit pattern at a time, and the unit pattern is linked to a previous pattern. This sequence is repeated to thus print graphics. A pattern of openings is composed of various openings corresponding to patterns for an IC. The openings include, as illustrated, small openings, large openings, rectangular openings, and openings shaped like a combination of rectangles.

According to a method of producing a block mask of a related art, whichever of large openings or small openings are to be created, first, a silicon substrate is coated with a resist. The silicon substrate is then exposed in order to delineate a pattern of openings, and then developed. The silicon substrate is then etched in order to make the openings. Wet etching or plasma etching is adopted as the etching method. At the etching step, an etching rate varies depending on the size of openings. This poses a problem in that if the silicon substrate were exposed proportionally to the size of openings, it would be impossible to create openings having a desired size. If the conditions for etching are determined so that when the silicon substrate is etched in order to create small openings and large openings all together, the small openings may have a desired size but, in this case, the large openings will have dimensions larger than the desired dimensions. Openings in a block mask are required to be very precise in size. Such an error in dimensions is not permissible.

To avoid this problem, it is conceivable to etch a substrate repeatedly for separately creating small openings and large openings. According to this method, lithography and etching must be repeated a plurality of times in order to produce one block mask. This leads to an increase in cost. Moreover, the time required for producing the block mask gets longer. This poses a problem in that the method cannot flexibly cope with the production of any kind of block mask.

Another conceivable method is to adjust an exposure pattern according to the size of an opening and thus delineate a pattern of openings having a desired size. In this method, the conditions for exposure must be calculated for each shape of openings, and thus varied depending on the shape thereof. This poses a problem in that exposure control becomes very complex.

SUMMARY OF THE INVENTION

An object of the present invention is to realize a method of producing a block mask for electron-beam lithography apparatuses according to which openings of a highly precise shape can be readily created irrespective of the size of the openings.

For accomplishing the object, a method of producing a block mask for electron-beam lithography apparatuses according to the present invention is such that the perimeters of large opening portions are exposed over a small width but the insides thereof are not exposed.

Specifically, the method of producing a block mask for electron-beam lithography apparatuses in accordance with the present invention is a method of producing a block mask to be employed in an electron-beam lithography apparatus. The electron-beam lithography apparatus is of a type that transmits an electron beam through openings of a kind that are selected from among a plurality of kinds of openings in a block mask, prints a unit pattern at a time, and links the unit pattern with a previous one. This sequence is repeated to print a desired pattern. The method of producing a block mask consists of four steps. At the first step, a resist is applied to the surface of a substrate of the block mask. At the next step, the resist is exposed to delineate patterns of a plurality of kinds of openings. At the next step, the exposed resist is developed. At the next step, the substrate of the block mask is etched. At the step of exposing the resist to delineate the patterns of a plurality of kinds of openings, for exposing the resist so as to delineate a pattern of openings larger than a predetermined size, the perimeters of corresponding opening portions of the resist are exposed by the predetermined width. At this time, the insides of the opening portions remain unexposed.

According to the method of producing a block mask for electron-beam lithography apparatuses in accordance with the present invention, the perimeter of each large opening portion is exposed to a small width. After etching is completed, the perimeter becomes a penetrating hole. The inside of the large opening portion is detached from the substrate of the block mask, whereby a larger hole is created. The width of the exposed perimeters is the same as that of small opening portions. The precision in positioning the margin of the perimeter of each large opening portion can be the same as positioning the small openings. Even when etching is carried out under the same conditions as those for small openings, highly precise openings can be created. This is feasible because openings of a block mask for electron-beam lithography apparatuses are hollow. By contrast, openings of a mask used to expose a photoresist are not hollow. For this reason, the method of producing a block mask has not been adopted in the past.

According to the present invention, even when large openings are to be delineated, the perimeters of large opening portions of a substrate should merely be exposed to a small width. When an electron-beam lithography apparatus is employed, it becomes unnecessary to repeatedly scan a substrate for exposure, though the repetition is required in related arts. This leads to a shorter exposure time.

The predetermined size is set to, for example, a quintuple of a minimum width of openings.

At the step of etching, an etching rate is set in conformity with small openings.

BRIEF DESCRIPTION OF THE DRAWINGS

The present invention will be more clearly understood from the description as set below with reference to the accompanying drawings, wherein:

FIG. 4A to FIG. 4C are diagrams for explaining a method of producing a block mask for electron-beam lithography apparatuses in accordance with the first embodiment of the present invention.

DESCRIPTION OF THE PREFERRED EMBODIMENTS

Before proceeding to the detailed description of the preferred embodiments, an electron beam exposure apparatus and a prior art method of producing a block mask will be described with reference to the accompanying drawings for a clearer understanding of the differences between the prior art and the present invention.

Figure 1:
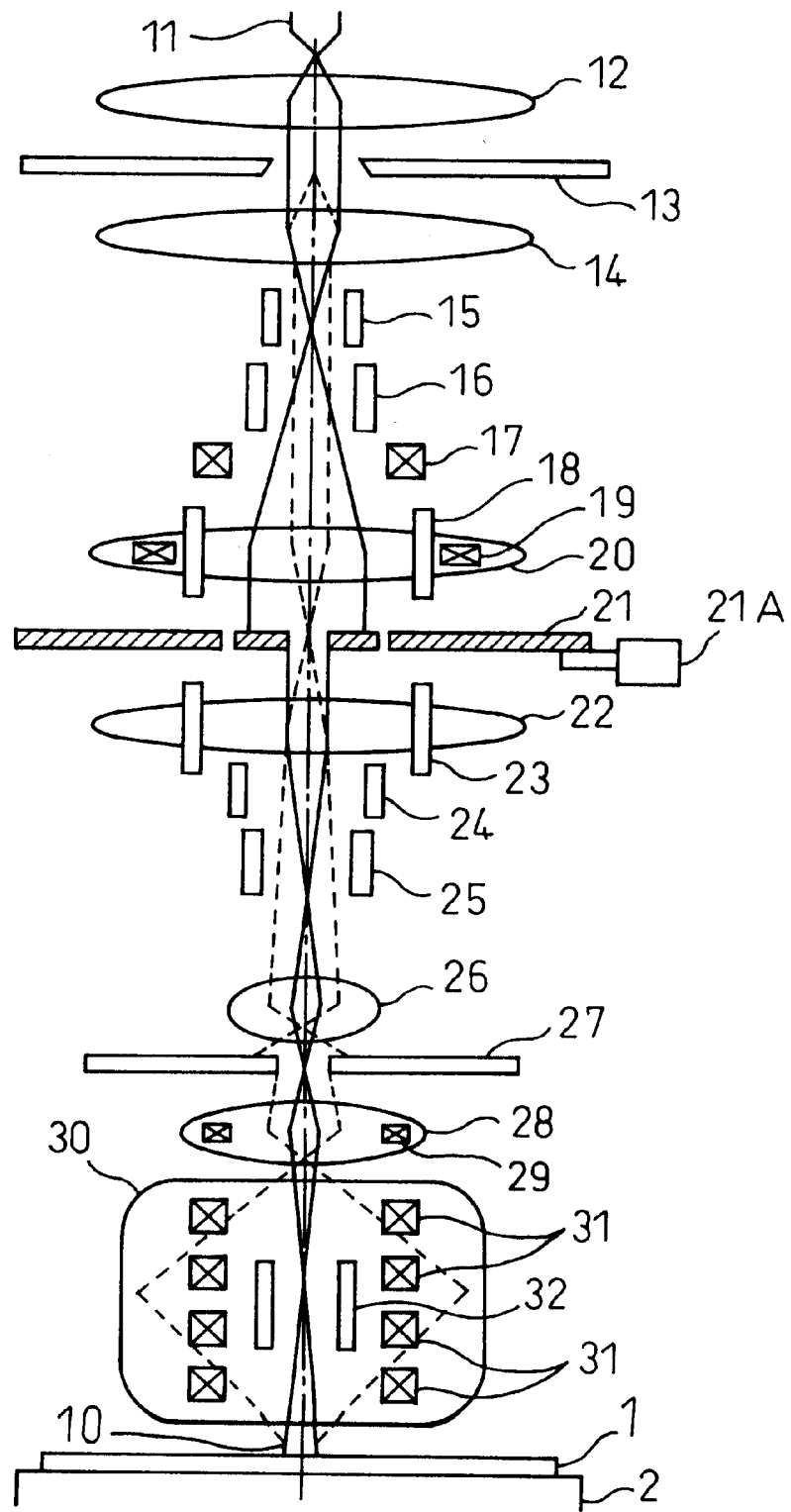
FIG. 1 is a diagram showing the structure of a portion of an electron-beam lithography apparatus including an optoelectronic column and exposure control unit.

To begin with, a description will be made of an electron-beam lithography apparatus of a block lithography type in which a block mask to be produced according to the method of the present invention is employed. FIG. 1 is a diagram showing the structure of a beam irradiation system in the electron-beam lithography apparatus of the block lithography type. In FIG. 1, there is shown an electron gun 11 for generating an electron beam. A first convergent lens 12 collimates an electron beam emanating from the electron gun 11. An aperture 13 reshapes a beam of parallel rays into a predetermined shape. A second convergent lens 14 narrows a reshaped beam. There are shown a reshaping deflector 15, a first mask deflector 16, a deflector 17 for dynamically correcting an astigmatism derived from a mask, a second mask deflector 18, a mask focusing coil 19, and a first reshaping lens 20. Also shown are a block mask 21 to be moved by a stage 21A, a second reshaping lens 22, a third mask deflector 23, and a blanking deflector 24 for controlling the on-off operation of a beam. Moreover, there are shown a fourth mask deflector 25, a third lens 26, a round aperture 27, a reduction lens 28, a focusing coil 29, a projection lens 30, an electromagnetic main deflector 31, and an electrostatic sub deflector 32. This assembly is referred to as an optoelectronic lens barrel (column). An electron beam 10 output from the column is irradiated to a sample (wafer) 1 placed on a stage 2. The stage is moved two-dimensionally on a plane perpendicular to the electron beam 10. The electron-beam lithography apparatus includes an exposure control unit for controlling the components of the column so that the sample can be exposed for transferring a desired pattern thereto. However, the exposure control unit has no direct relationship to the present invention. A description of the exposure control unit will therefore be omitted.

Figure 2:
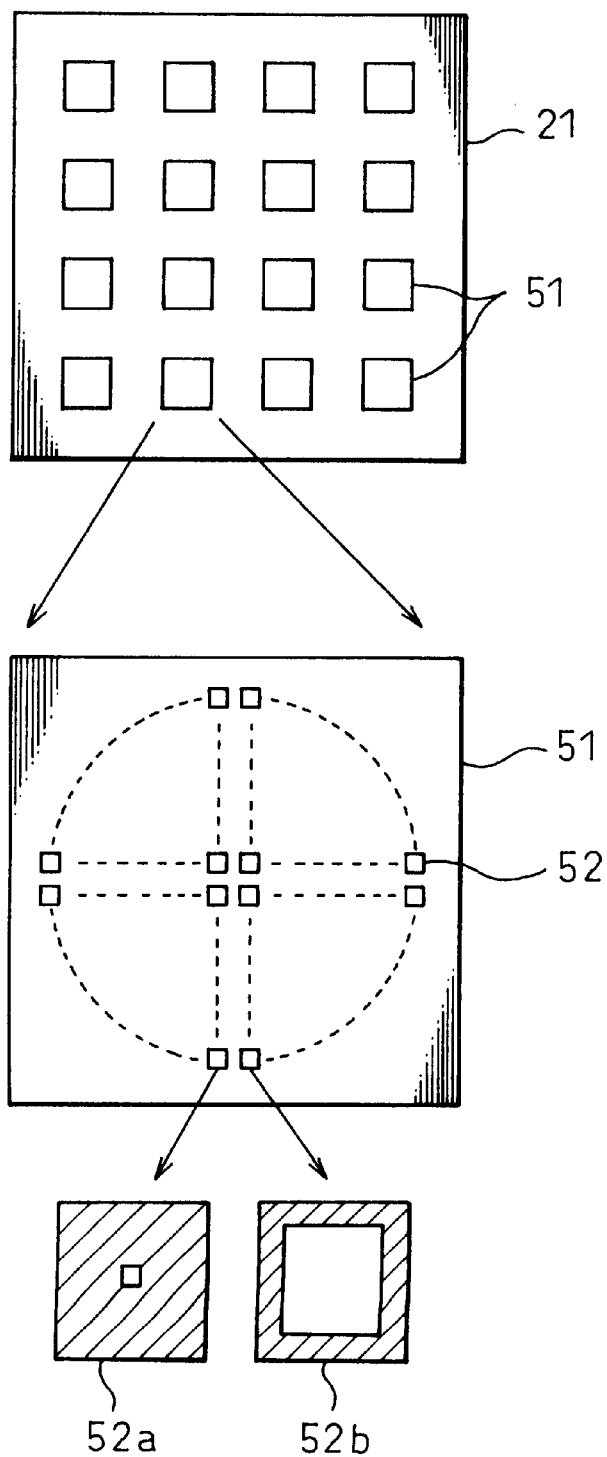
FIG. 2 is a diagram showing a block mask for electron-beam lithography apparatuses.

FIG. 2 is a diagram for explaining the block mask 21. The block mask 21 is formed of a thin silicon substrate about, for example, 20 $\mu$m thick having holes bored therein. The holes each correspond to a unit pattern that is a unit of repetitive graphics. The holes are referred to as openings. A range is defined within which an electron beam can be deflected in order to select an opening. A plurality of block areas 51 is defined within the range. A pattern of numerous different openings 52 is delineated in each block area 51. Any opening in each block area 51 can be selected quite shortly. If an opening in another block area 51 must be used, the block mask 21 is moved by the stage 21A. The block area 51 concerned is thus positioned on an optical path along which the electron beam propagates.

A pattern of openings is composed of small openings 52a and large openings 52b like the illustrated ones, rectangular openings, openings shaped like a combination of rectangles, and others. Thus, various kinds of openings are created according to a pattern for an IC.

Figure 3A:
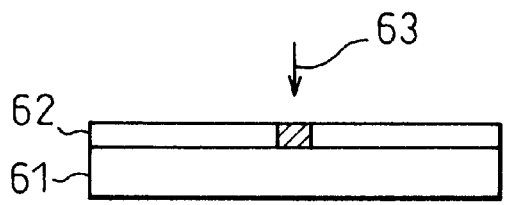
FIG. 3A to FIG. 3D are diagrams for explaining a method of producing a block mask for electron-beam lithography apparatuses in accordance with a related art.
Figure 3C:
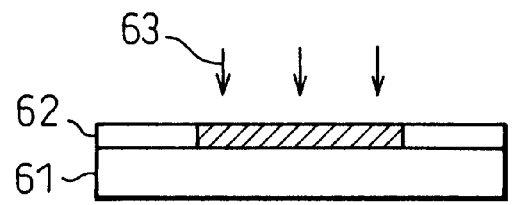
Figure 3B:
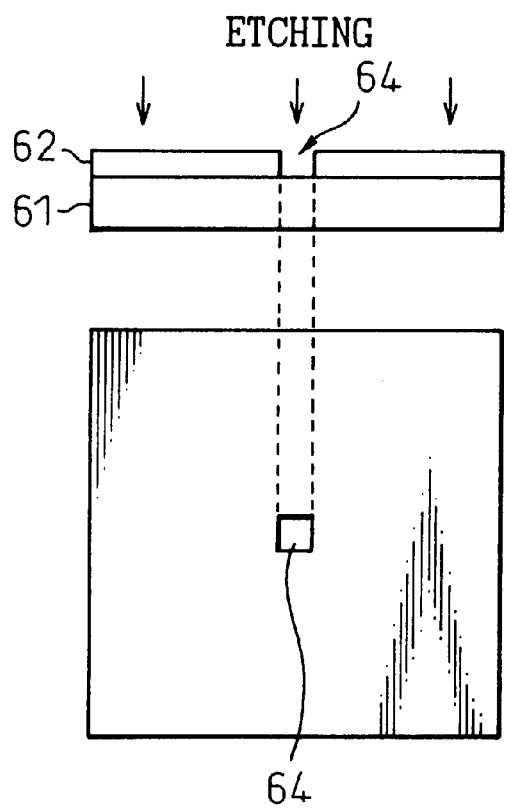

FIG. 3A to FIG. 3D are diagrams for explaining a method of producing a block mask 21. FIG. 3A and FIG. 3B explain a process of creating small openings, while FIG. 3C and FIG. 3D explain a process of creating large openings. A block area 51 in the block mask 21 is formed with a silicon substrate 61 of about 20 $\mu$m thick. The silicon substrate 61 is coated with oxide. A resist 62 is applied to the silicon substrate 61. The silicon substrate 61 is then exposed by an electron beam 63 in order to bore openings. When an electron-beam lithography apparatus is used to create large openings like the one shown in FIG. 3C, a substrate is scanned by sweeping an electron beam many times and thus exposed by multiple scanning lines. Incidentally, normal lithography may be substituted for electron-beam lithography using the electron beam 63. An electron beam passing through an opening of the block mask 21 is reduced and then irradiated. The size of openings of the block mask 21 may therefore be larger than that of openings of a pattern to be delineated. For this reason, photolithography may be adopted.

As shown in FIG. 3A and FIG. 3C, the silicon substrate is exposed according to a pattern of openings and then developed. Exposed parts of the resist 62 are thus removed. Holes 64 and 65 that are openings are thus created in the resist layer 62. In this state, plasma etching is performed on the surface of the silicon substrate to which the resist 62 has been applied. Consequently, the oxide is removed from the holes 64 and 65. Only the portions of the silicon substrate in the holes 64 and 65 are etched, whereby holes, that is, openings are created in the silicon substrate 61 according to an exposure pattern. Thus, openings are created in the block mask 21.

Figure 3D:
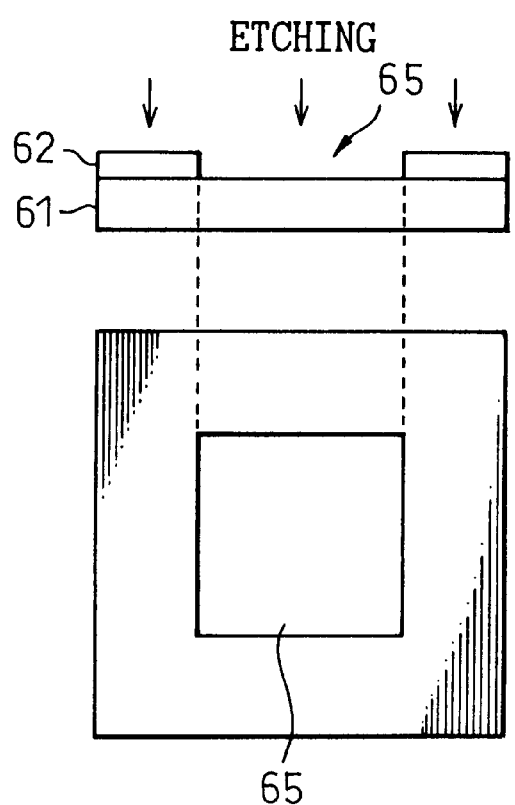

The block mask 21 is produced as mentioned above. A rate of etching to be carried out at the etching step varies depending on the size of openings. If opening portions of a substrate were exposed proportionally to the sizes of openings, a problem occurs because openings of desired sizes cannot be created. For example, assume that small opening portions and large opening portions like those shown in FIG. 3B and FIG. 3D are etched simultaneously.

In this case, if the conditions for etching were set so that small openings have a desired size, large openings would get larger than a desired dimension. Openings in the block mask 21 are required to be very precise in size. Such an error is not permissible.

For avoiding this problem, it is conceivable to etch a substrate separately for small openings and large openings. In this case, lithography and etching must be carried out a plurality of times in order to produce one block mask 21. This leads to an increase in cost. Moreover, the time required to produce the block mask 21 gets longer. This poses a problem in that this method cannot flexibly cope with production of any kind of block mask.

Moreover, it is conceivable to adjust an exposure pattern according to the sizes of openings and create openings of desired sizes. In this case, it is necessary to calculate the conditions for exposure for each shape of openings and thus vary the conditions. This poses a problem in that a sequence of controlling exposure is very complex.

FIG. 4A to FIG. 4C are diagrams for explaining a method of producing a block mask for electron-beam lithography apparatuses in accordance with the first embodiment of the present invention. FIG. 4A to FIG. 4C are concerned with creation of large openings like the one shown in FIGS. 3C and 3D. Small opening portions of a substrate are exposed and etched as those described in conjunction with FIG. 3A and FIG. 3C.

As shown in FIG. 4A, a resist 62 is applied to a silicon substrate 61 in the same manner as that in the related art. For exposing large opening portions of the substrate, each portion is exposed by a predetermined width along the perimeter thereof. A hatched part 71 is the exposed portion. This leads to an exposure time shorter than the one required when a wide range must be scanned and exposed. The other portions of the silicon substrate 61 are exposed according to patterns of different kinds of openings. The silicon substrate is then developed, whereby the resist layer is removed from the hatched parts 71. Consequently, holes 72 are bored in the resist layer. Thereafter, plasma etching and wet etching are carried out as shown in FIG. 4B. The portions of the silicon substrate 61 coincident with the holes 72 of the resist layer are cut out, and holes 73 are bored as shown in FIG. 4C. Eventually, portions 61b of the silicon substrate and portions 62b of the resist coincident with the inside parts enclosed by the holes 72 are detached at the margins thereof. This results in openings defined along the outer margins of the exposed hatched parts 71.

The hatched parts 71 are so narrow that they are etched at the same etching rate as small openings. Once the conditions for etching are set in conformity with the small openings, the holes 73 are bored with a desired width in the hatched parts 71. The dimension of the bored large openings are as per a designed value.

The foregoing method should preferably be adapted to a pattern of openings whose width is equal to or larger than a quintuple of a minimum design dimension. Moreover, even for printing a pattern of openings, of which shapes may not be precise, in the whole of one block or one block area, opening portions of a substrate are exposed along the perimeters thereof in a band-like form. In this case, it is unnecessary to expose each opening portion by a width approximate to a minimum design dimension. Each opening portion should merely be exposed by a width ranging from several micrometers to several tens of micrometers.

Figure 5:
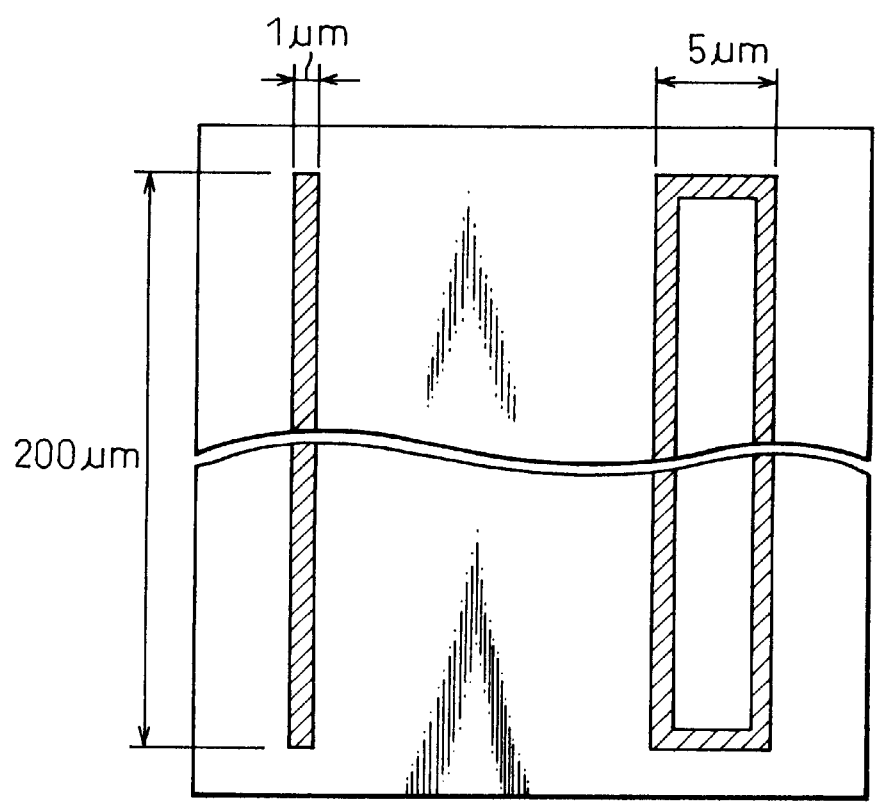
FIG. 5 is a diagram showing an exposure pattern of openings to be delineated on a block mask for electron-beam lithography apparatuses in accordance with the second embodiment of the present invention.

FIG. 5 is a diagram showing an exposure pattern for a block mask in accordance with the second embodiment of the present invention. In the second embodiment, a pattern of elongated openings is printed. The elongated openings have the sizes of 1 μm by 200 μm and 5 μm by 200 μm. As illustrated, for printing the openings of 1 μm by 200 μm in size, an electron beam of 1 μm wide is irradiated over a length of 200 μm. For printing the openings of 5 μm by 200 μm in size, an electron beam of 1 μm wide is irradiated to expose the perimeters of opening portions of a substrate. The inside of each opening portion that is not exposed is, therefore, 3 μm by 198 μm in size. After the opening portions of the substrate are exposed, they are etched under the same conditions. This results in highly precise elongated openings of 1 μm by 200 μm and 5 μm by 200 μm in size.

For exposing opening portions of a substrate, the electron-beam lithography apparatus shown in FIG. 1 can be adopted. Moreover, a step-and-repeat lithography system with reduction or any other photolithography apparatus may be used to expose the opening portions.

As described so far, according to the present invention, a block mask for electron-beam lithography apparatuses can be produced readily. The block mask has openings created with highly precise shapes irrespective of the sizes of the openings. This leads to a decrease in the cost of producing the block mask and eventually to a reduction in cost of manufacturing a semiconductor device. Moreover, the time required for producing the block mask is shorter than for a conventional one. Production of any kind of block mask can therefore be handled more flexibly.

What is claimed is:

1. A method of producing a block mask to be employed in an electron-beam lithography apparatus of a type that produces a unit pattern at a time by transmitting an electron beam through openings selected from among a plurality of kinds of openings of a block mask, links the unit pattern with a previous one, and repeats this process to delineate a desired pattern, said method of producing a block mask for electron-beam lithography apparatuses comprising:

a step of applying a resist to the surface of a substrate of said block mask;

a step of exposing said resist to delineate patterns of the plurality of kinds of openings;

a step of developing said exposed resist; and a step of etching said substrate of said block mask, at said step of exposing said resist to delineate the patterns of said plurality of kinds of openings, when said resist must be exposed to delineate a pattern of openings that are larger than a predetermined size, the perimeters of corresponding opening portions of said resist are exposed by a predetermined width, but the insides thereof remain unexposed.

2. A method of producing a block mask for electron-beam lithography apparatuses according to claim 1 wherein, at said step of etching, an etching rate is set in conformity with small openings.

3. A method of producing a block mask for electron-beam lithography apparatuses according to claim 2 wherein said predetermined size is a quintuple of a minimum width of openings.

4. A method of producing a block mask for electron-beam lithography apparatuses according to claim 1 wherein said predetermined size is a quintuple of a minimum width of openings.

* * * * *